United States Patent
Chung et al.

(10) Patent No.: US 10,850,708 B2
(45) Date of Patent: *Dec. 1, 2020

(54) IN-VEHICLE CONTROL APPARATUS USING SMART KEY PROVIDED WITH DISPLAY AND METHOD OF CONTROLLING THE SAME

(71) Applicants: HYUNDAI MOTOR COMPANY, Seoul (KR); KIA MOTORS CORPORATION, Seoul (KR)

(72) Inventors: Jae Hoon Chung, Hwaseong-si (KR); Sung Un Kim, Yongin-si (KR); Si Hoon Sung, Hwaseong-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/690,393

(22) Filed: Nov. 21, 2019

(65) Prior Publication Data
US 2020/0189520 A1 Jun. 18, 2020

(30) Foreign Application Priority Data
Dec. 13, 2018 (KR) .................. 10-2018-0161213

(51) Int. Cl.
| | | |
|---|---|---|
| B60R 25/24 | (2013.01) | |
| G07C 5/08 | (2006.01) | |
| H05K 5/00 | (2006.01) | |
| G06F 3/14 | (2006.01) | |
| G08C 17/02 | (2006.01) | |
| H05K 5/02 | (2006.01) | |
| G06F 3/0484 | (2013.01) | |

(52) U.S. Cl.
CPC ............ *B60R 25/24* (2013.01); *G06F 3/1423* (2013.01); *G07C 5/0825* (2013.01); *G08C 17/02* (2013.01); *H05K 5/0017* (2013.01); *H05K 5/0086* (2013.01); *H05K 5/0217* (2013.01); *G06F 3/04845* (2013.01); *G08C 2201/32* (2013.01)

(58) Field of Classification Search
CPC ..... B60R 25/24; B60R 25/241; G06F 3/1423; G08C 17/04; H05K 5/0017
See application file for complete search history.

(56) References Cited

U.S. PATENT DOCUMENTS

2020/0164835 A1* 5/2020 Chung ............... G07C 9/00563

* cited by examiner

*Primary Examiner* — Curtis B Odom
(74) *Attorney, Agent, or Firm* — McDonnell Boehnen Hulbert & Berghoff LLP

(57) ABSTRACT

A user interface capable of controlling various functions in a vehicle is disclosed. The vehicle control method using a smart key includes an integrated operation unit detecting attachment of the smart key through a smart key detector disposed in a predetermined attachment area inside a vehicle, the integrated operation unit transmitting information on a controlled function corresponding to a vehicle state to the smart key, outputting a first user interface corresponding to the information on the controlled function on a first display of the smart key, transmitting information on a result of operation from the smart key to the integrated operation unit when an operation unit provided in the smart key is operated, and the integrated operation unit controlling the controlled function based on the information on the result. The smart key is fixed in the attachment area using magnetic force.

20 Claims, 15 Drawing Sheets

510    120

200

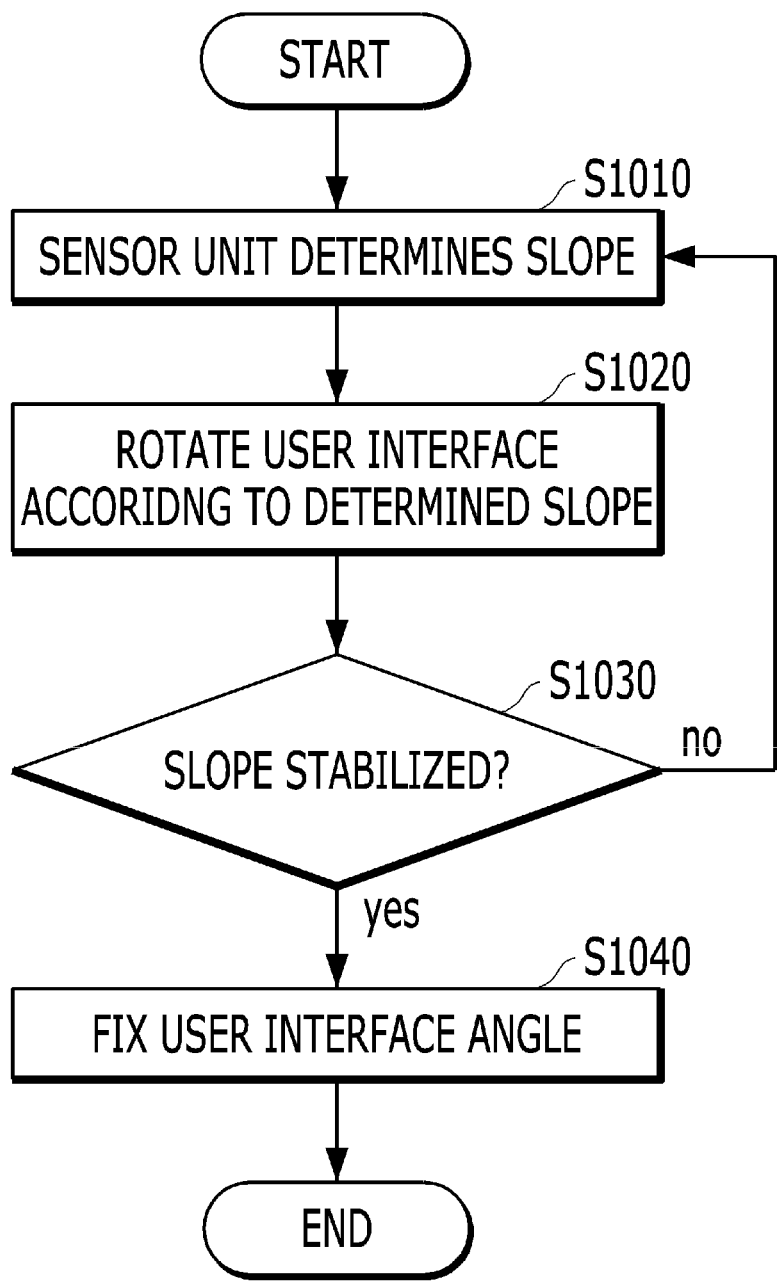

IN-VEHICLE CONTROL APPARATUS USING SMART KEY PROVIDED WITH DISPLAY AND METHOD OF CONTROLLING THE SAME

CROSS REFERENCE TO RELATED APPLICATION

This application claims the benefit of Korean Patent Application No. 10-2018-0161213, filed on Dec. 13, 2018, which is hereby incorporated by reference as if fully set forth herein.

BACKGROUND

Field

The present disclosure relates to a user interface capable of controlling various functions in a vehicle and, more particularly, to an in-vehicle control apparatus using a smart key provided with a display and a method of controlling the same.

Discussion of the Related Art

A smart key wirelessly recognized within a certain distance outside a vehicle or inside the vehicle without putting a key into the vehicle is generally applied to newest vehicles.

Such a smart key is generally divided into a card key having a flat shape and a fob key having a polygonal/elliptical flat shape and has a plurality of key buttons on an upper surface thereof. One key button is mapped to one function. As the number of functions allowing control through the smart key increases, the number of key buttons increases. For example, recently, the configuration of the key buttons of the smart key have been complicated by applying new technology such as remote automatic parking. Demand for remotely calling and controlling the vehicle will further increase in the future.

However, such a smart key is widely used to control various functions through the key buttons outside the vehicle, but is only used to allow start through detection or to release an immobilizer inside the vehicle.

SUMMARY

Accordingly, the present disclosure is directed to an in-vehicle control apparatus using a smart key provided with a display and a method of controlling the same that substantially obviate one or more problems due to limitations and disadvantages of the related art.

An object of the present disclosure is to provide a more convenient in-vehicle operation system, and a method of controlling the same.

Another object of the present disclosure is to provide a vehicle apparatus capable of controlling various vehicle functions using a smart key provided with a display, and a method of controlling the same.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a vehicle control method using a smart key includes an integrated operation unit detecting attachment of the smart key through a smart key detector disposed in a predetermined attachment area inside a vehicle, the integrated operation unit transmitting information on a controlled function corresponding to a vehicle state to the smart key, outputting a first user interface corresponding to the information on the controlled function on a first display of the smart key, transmitting information on a result of operation from the smart key to the integrated operation unit when an operation unit provided in the smart key is operated, and the integrated operation unit controlling the controlled function based on the information on the result. The smart key is fixed in the attachment area using magnetic force.

In another aspect of the present disclosure, an in-vehicle operation system includes an integrated operation unit including a smart key detector disposed in a predetermined attachment area in a vehicle, a first display disposed around the smart key detector to display a first user interface for a controlled function corresponding to a vehicle state and a controller configured to perform control to transmit information on the controlled function to the smart key when attachment of the smart key in the attachment area is detected through the smart key detector. The integrated operation unit receives information on a result of operation through an operation unit provided in the smart key from the smart key and controls the controlled function based on the information on the result, and the smart key detector includes an electromagnet for fixing the smart key in the attachment area at the rear surface of the first display.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings:

FIG. 10 is a view showing an example of a user interface alignment process according to an embodiment of the present disclosure;

DETAILED DESCRIPTION

Figure 1:
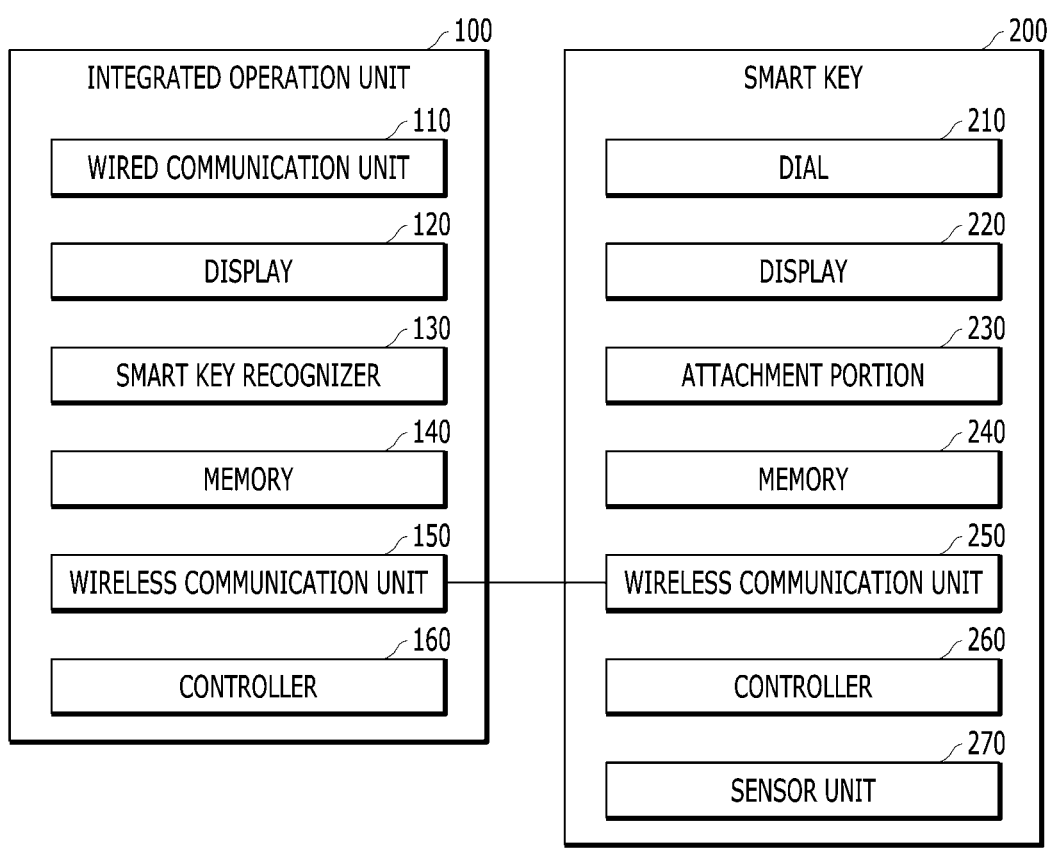
FIG. 1 is a view showing an example of the structure of an in-vehicle operation system including a smart key according to an embodiment of the present disclosure.

Hereinafter, the embodiments of the present disclosure will be described in detail with reference to the accompanying drawings so as to be easily implemented by those skilled in the art. However, the present disclosure may be variously implemented and is not limited to the embodiments described herein. In the drawings, in order to clearly describe the present disclosure, portions which are not related to the description of the present disclosure will be omitted and similar portions are denoted by similar reference numerals throughout the specification.

In the entire specification, when a certain portion "includes" a certain component, this indicates that the other components are not excluded, but may be further included unless specially described. The same reference numbers will be used throughout the drawings to refer to the same or like parts.

In the embodiments of the present disclosure, in control of a vehicle function, when a smart key provided with a display is attached to a predetermined point inside a vehicle, it is possible to control various vehicle functions.

First, the structure of an in-vehicle operation system including a smart key applicable to the embodiments of the present disclosure will be described with reference to FIG. 1. FIG. 1 is a view showing an example of the structure of an in-vehicle operation system including a smart key according to an embodiment of the present disclosure.

Referring to FIG. 1, the in-vehicle operation system according to the embodiment may include an integrated operation unit 100 and a smart key 200.

The integrated operation unit 100 may include a wired communication unit 110, a display 120, a smart key recognizer 130, a memory 140, a wireless communication unit 150, and a controller 160. Hereinafter, these components will be described in detail.

The wired communication unit 110 may exchange data with a controller for controlling at least a plurality of controlled functions inside the vehicle. For example, the wired communication unit 110 may support at least one of vehicle communication schemes such as CAN (controller area network), CAN-FD (CAN with flexible data rate), LIN (Local Interconnect Network) or Ethernet. In another example, the wired communication unit 110 may receive operation state information from an air conditioner for controlling an air conditioning function, a body controller for performing a convenience function such as a seat and an audio/video/navigation (AVN) system and transmit a control command.

The display 120 serves to visually output a vehicle operation state such as a navigation guidance screen, operation state information of an air conditioner system, playback state information of a multimedia function or a variety of information necessary for a driver, and may display a virtual operation system for controlling at least some functions and detect a touch command input to the virtual operation system, when the display is a touchscreen.

The smart key recognizer 130 may detect whether the smart key 200 is detached. For example, the smart key recognizer 130 may include at least one of a Hall sensor for detecting magnetic force, an NFC transceiver for performing NFC communication or a wireless charging transmitter for detecting a wireless charging receiver. That is, the smart key 200 may be detected by the Hall sensor when a permanent magnet is provided in the smart key 200, the smart key 200 may be detected by the NFC transceiver when an NFC tag is provided in the smart key 200, and the smart key 200 may be detected by the wireless charging transmitter when the wireless charging receiver is provided in the smart key 200. Of course, such a detection unit is an example and the present disclosure is not limited thereto. In addition, the smart key recognizer 130 detects whether the smart key 100 is attached to the integrated operation unit 100 at a specific position separately from a smart key controller for controlling whether the smart key is present inside the vehicle.

The memory 140 may store an operating system for driving the integrated operation unit 100, various application programs operating on the operating system, multimedia content, input/output control information, etc.

The wireless communication unit 150 may be connected to at least a wireless communication unit 250 of the smart key 200 using a short-range communication protocol (e.g., Bluetooth, Wi-Fi, ZigBee, NFC, etc.) or a 3/4/5G protocol to perform data exchange. Of course, the wireless communication unit 150 may communicate with another component inside the vehicle, such as an AVN system.

The controller 160 performs overall control of the above-described components and may perform determination and operation necessary to control controlled functions through interworking with the smart key 200 according to the below-described embodiments of the present disclosure.

Meanwhile, the smart key 200 may include a dial 210 (or a wheel), a display 220, an attachment portion 230, a memory 240, a wireless communication unit 250, a controller 260, and a sensor unit 270.

First, the memory 240 may store an operating system for driving the smart key 200, identification information of each controlled function, a graphical user interface to be output on a display for each controlled function, input/output control information of the smart key 200, etc.

The wireless communication unit 250 may be connected to at least a wireless communication unit 150 of the integrated operation unit 100 using a short-range communication protocol (e.g., Bluetooth, Wi-Fi, ZigBee, NFC, etc.) or a 3/4/5G protocol to perform data exchange. Of course, in some embodiments, the wireless communication unit 250 may be configured to perform communication with a telematics server or another smart device (e.g., a smartphone, a tablet, etc.). In addition, the wireless communication unit 250 may include a RF (e.g., UHF, LF, etc.) communication module for performing wireless communication with a smart key controller SMK of the vehicle in order to perform the general functions of the smart key, such as door lock setting/releasing, or other functions performed outside the vehicle.

The controller 260 performs overall control of the other components and may perform determination and operation necessary to control controlled functions through interworking with the integrated operation unit 100 according to the below-described embodiments of the present disclosure.

The sensor unit 270 may include at least one sensor capable of detecting a direction in which the smart key 200 is disposed. For example, the sensor unit 270 may include at least one of a gyro sensor or an acceleration sensor. Since the smart key 200 has a cylindrical appearance and includes a circular display 220, when the smart key 130 is attached at an attachment position corresponding to the smart key recognizer 130, a display state is adjusted such that a user interface is displayed on the display 220 in a forward direction from the viewpoint of a driver.

Here, the forward direction means a direction in which text or image configuring a user interface displayed on the display 220 is predicted to be displayed by the driver. For example, when the shape of the display 220 or the smart key is rectangular, the driver may intuitively attach the smart key such that the long or short side of the rectangle is parallel to a vertical direction and the displayed user interface always satisfies the forward direction in a landscape mode or a portrait mode. However, when the smart key 200 has a cylindrical appearance and a circular display 220, it is difficult for the driver to intuitively attach the smart key 200 at a specific angle. Accordingly, in the display 220 of the smart key 200 according to the embodiment, when text of one row extending in the horizontal direction is aligned and displayed in a direction perpendicular to the direction of gravity, the text may be regarded as being displayed in the forward direction. As a result, when the attachment direction of the smart key detected by the sensor unit 270 is detected, the controller 260 may control the display 220 to rotate, realign or reconfigure a UI such that the user interface is displayed in the forward direction based on the detected direction. Such a function will be described below in greater detail.

Figure 2A:
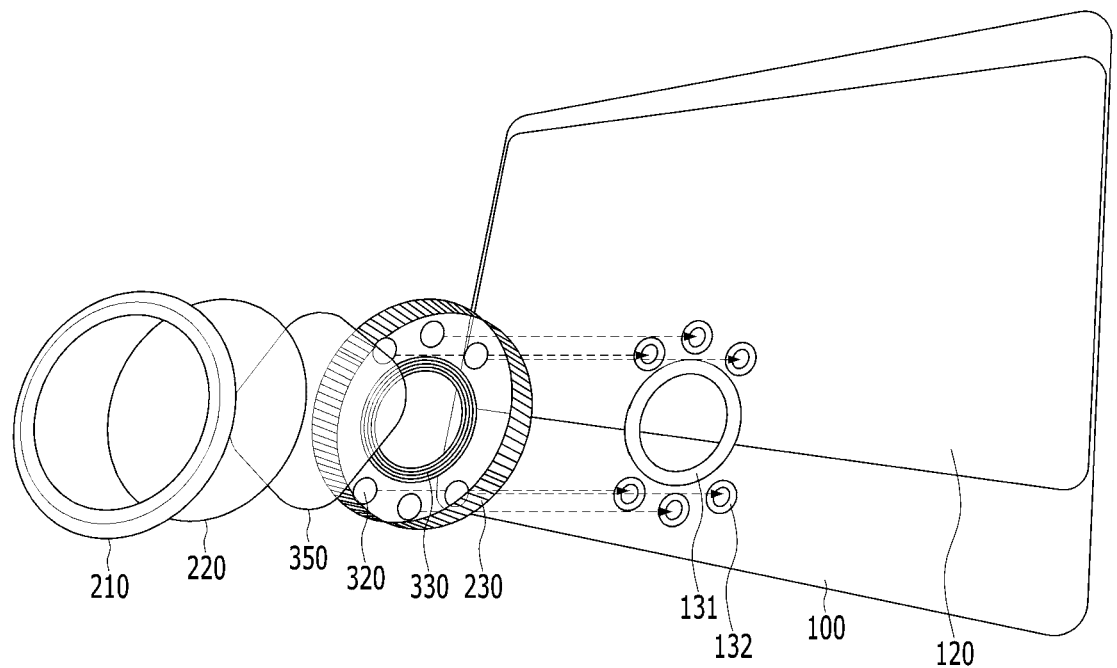
FIG. 2A is a view illustrating the configuration of a smart key and an integrated operation unit according to an embodiment of the present disclosure.
Figure 2B:
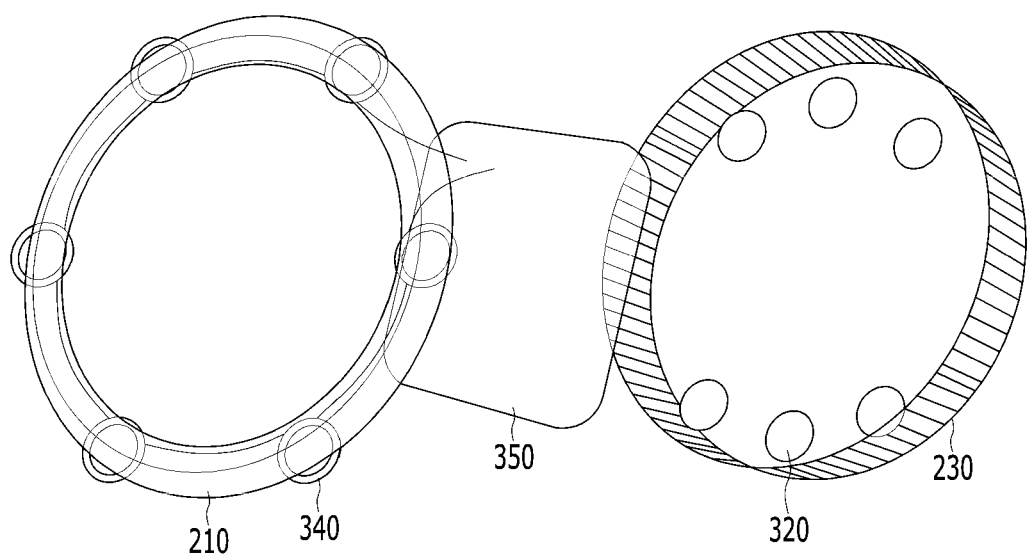
FIG. 2B is a view illustrating an example of the structure of a smart key including a coil provided in a dial according to an embodiment of the present disclosure.

The dial 210, the display 220, and the attachment portion 230 will be described with reference to FIGS. 2A and 2B. FIG. 2A is a view illustrating the configuration of a smart key and an integrated operation unit according to an embodiment of the present disclosure, and FIG. 2B is a view illustrating an example of the structure of a smart key including a coil provided in a dial according to an embodiment of the present disclosure.

Referring to FIG. 2A, the smart key 200 according to the embodiment may have a cylindrical appearance. Specifically, the smart key 200 may have a toroidal or ring-shaped dial 210 surrounding a circular display 220. The rear surface opposite to the front surface of the display 220 may be provided with an attachment portion 230 including a contact surface attached to the display 120 of the integrated operation unit 100. In some embodiments, the attachment portion 230 may configure at least a portion of the housing of the smart key 200.

The dial 210 may be configured to rotate about the display 220 and to detect at least a direction and degree of rotation (e.g., displacement or angle) when a user grabs and rotates the dial. Of course, the present disclosure is not limited to a detailed unit or method for detecting rotation.

The display 220 has a circular appearance. An actual display area does not necessarily correspond to an outer area defined by the inner diameter of the dial 210 and does not necessarily have a circular shape. In addition, the display 220 is implemented in the form of a touchscreen and may be configured to receive a touch command input to the display 220 and the display 220 may be configured to include a push button function. In addition, a detection member formed of a piezoelectric material is disposed on the lower surface of the display 220 in a predetermined array form and a fingerprint sensor is provided by connecting electrodes. The substrate 350 on which the memory 240 and the controller 260 are mounted may be disposed on the back of the display 220.

As described above, the attachment portion 230 may include a portion to be recognized (e.g., one or more permanent magnets 320, an NFC tag, a wireless charging reception coil 330, etc.) corresponding to the smart key recognizer 130. At this time, the permanent magnets 320 may be arranged in correspondence with the magnetic materials disposed in the peripheral area of the display 120 or the rear surface of the display 120 of the integrated operation unit 100, thereby being attached to the magnetic materials such as the permanent magnets or the electromagnets 132 by magnetic force. Of course, the position of the wireless charging reception coil 330 may correspond to the position of the wireless charging transmission coil 131 of the integrated operation unit 100.

At this time, the magnitude of the magnetic force may be greater than rotation resistance of the dial 210 while detachment does not occur by vibration generally occurring in traveling of the vehicle when the smart key 200 is attached to a predetermined area, in order to prevent a phenomenon wherein the smart key 200 itself rotates (e.g., the display 220 also rotates) without moving the dial from the viewpoint of the smart key 200 in the case where magnetic force is less than rotation resistance when the user rotates the dial 210.

Of course, it is apparent to those skilled in the art that the magnitude of the magnetic force may vary according to the weight of the smart key 200, an angle between the position where the smart key 200 is attached inside the vehicle and the ground and the rotation resistance of the dial 210.

In addition, the integrated operation unit 100 may gradually increase the magnetic force of the electromagnets 132 to induce attachment, when the smart key approaches the attachment area within a predetermined distance while the smart key recognizer 130 detects whether the smart key approaches.

Referring to FIG. 2B, at least one coil 340 may be provided in the dial 210. The number and position of each of the at least one coil 340 may corresponds to those of the permanent magnets 320. In this case, emergency charging is possible through rotation of the dial 210. Such a function is using an electromagnetic induction phenomenon between the coils 340 and the permanent magnets 320.

Figure 3A:
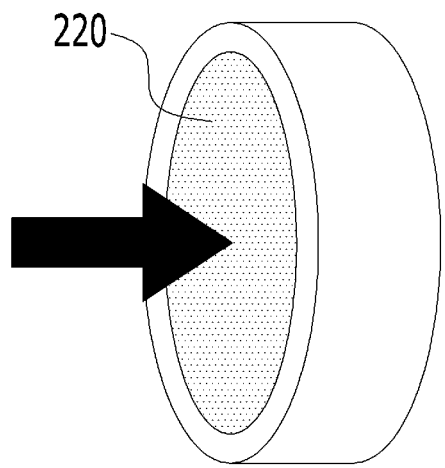
FIGS. 3A, 3B, and 3C are views showing an example of an operating form of an operation system according to an embodiment of the present disclosure.
Figure 3B:
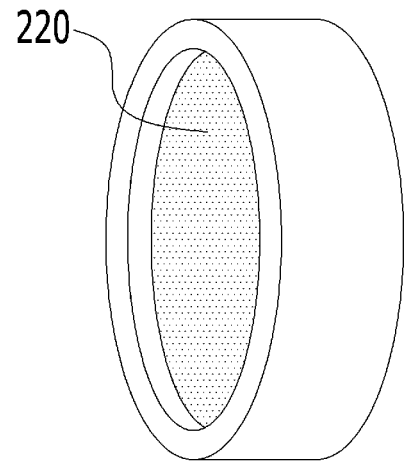
Figure 3C:
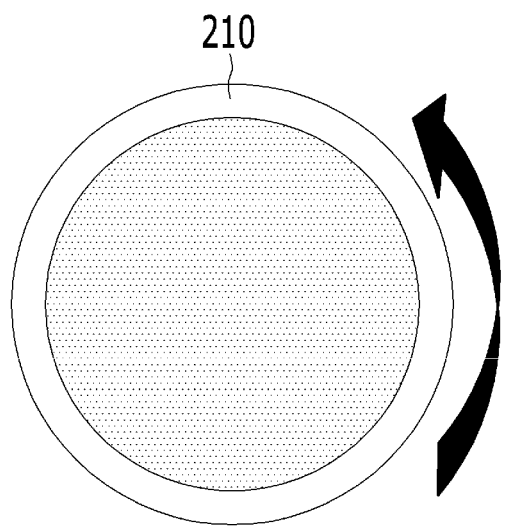

Next, the operation method of an operation system according to the embodiment will be described with reference to FIGS. 3A to 3C. FIGS. 3A to 3C are views showing an example of an operation form of an operation system according to an embodiment of the present disclosure.

First, when the smart key 200 has a push button, the front surface of the dial 210 or the display 220 may be pressed.

For example, when the display 220 is pressed as shown in FIG. 3A, the display 220 may be retracted by a certain distance in the pressed direction as shown in FIG. 3B. Of course, in the case where the display 220 is implemented as a touchscreen, only touch input may be recognized when the touchscreen is touched at predetermined pressure or less. For example, a touch command may include simple touch, long touch, double touch of inputting simple touch twice for a predetermined time, touch-drag/flicking touch input of dragging in a touched state in an arbitrary direction and then releasing touch. The touch commands may correspond to different types of control commands, respectively.

Alternatively, as shown in FIG. 3C, the smart key 200 may be operated to rotate the dial 210 clockwise or counterclockwise.

Hereinafter, a process of performing the interworking function of the smart key and the integrated operation unit based on the configuration of the apparatus will be described with reference to FIGS. 4A and 4B.

Figure 4A:
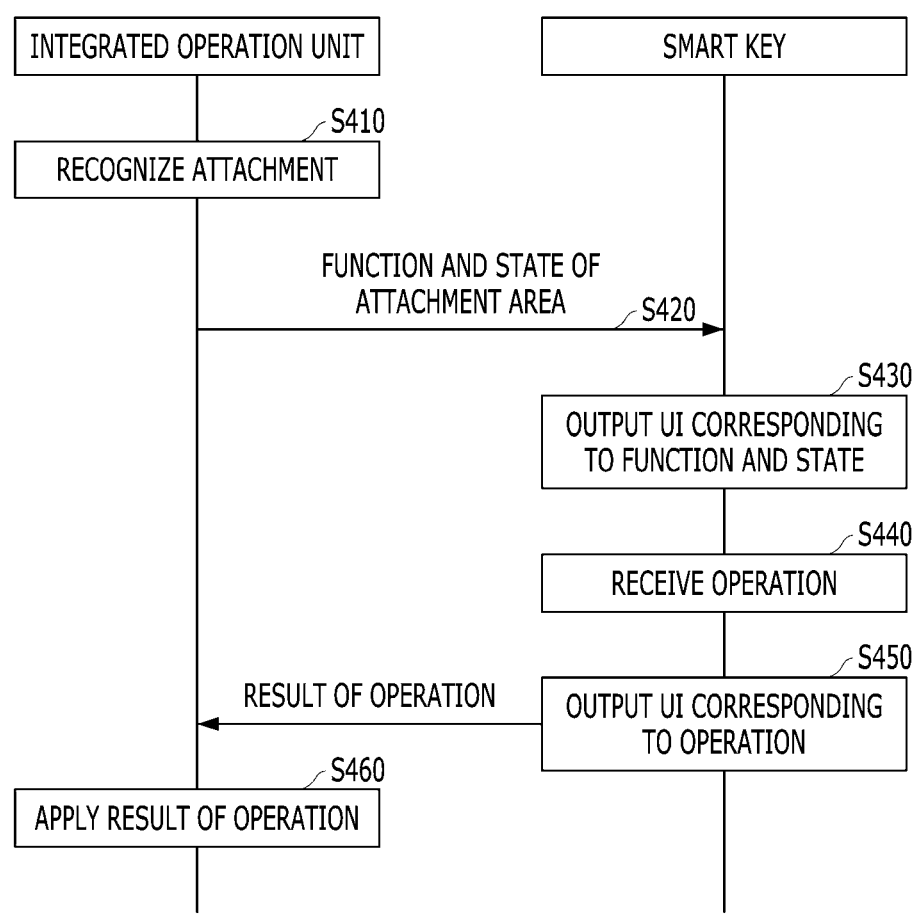
FIG. 4A is a flowchart illustrating an example of a process of operating a vehicle display system including a smart key according to an embodiment of the present disclosure.

FIG. 4A is a flowchart illustrating an example of a process of operating an in-vehicle display system including a smart key according to an embodiment of the present disclosure.

Referring to FIG. 4A, as the smart key 200 is attached at a predetermined position, the integrated operation unit 100 may detect whether the smart key 200 is attached (or an attachment position) through the smart key recognizer 130 (S410).

The integrated operation unit 100 may transmit information on the controlled function according to the current vehicle state to the smart key 200 through the wireless communication unit 150 (S420). Here, the information on the controlled function may include the type of the controlled function and the current state information of the function. For example, the controlled function according to the vehicle state may be a start button function before starting the vehicle after the driver rides in the vehicle or a function for welcoming the owner of the vehicle, but is merely an example and the present disclosure is not limited thereto.

The smart key 200 may output a graphical user interface (UI) corresponding to the controlled function and the current state on the display 220 based on the received information (S430).

Thereafter, when the dial 210 is operated or when user input such as touch input or push input is received on the display 220 (S440), the smart key 200 may output a user interface corresponding to the operation (that is, change in state information output through the user interface) on the display 220 (S450). Information on the operation (e.g., an operation amount, a control amount, an operation direction, the type of a changed function, etc.) may be transmitted to the integrated operation unit 100 through the wireless communication unit 250.

The integrated operation unit 100 may apply the result of operation to the controlled function based on the information on the operation (S460).

Meanwhile, before the smart key 200 is attached, a predetermined function may be performed in the vehicle when the driver rides in the vehicle in a state of carrying the smart key 200. This will be described with reference to FIG. 4B. FIG. 4B is a flowchart illustrating an example of a process of performing a function when a smart key enters a vehicle according to an embodiment of the present disclosure.

Figure 4B:
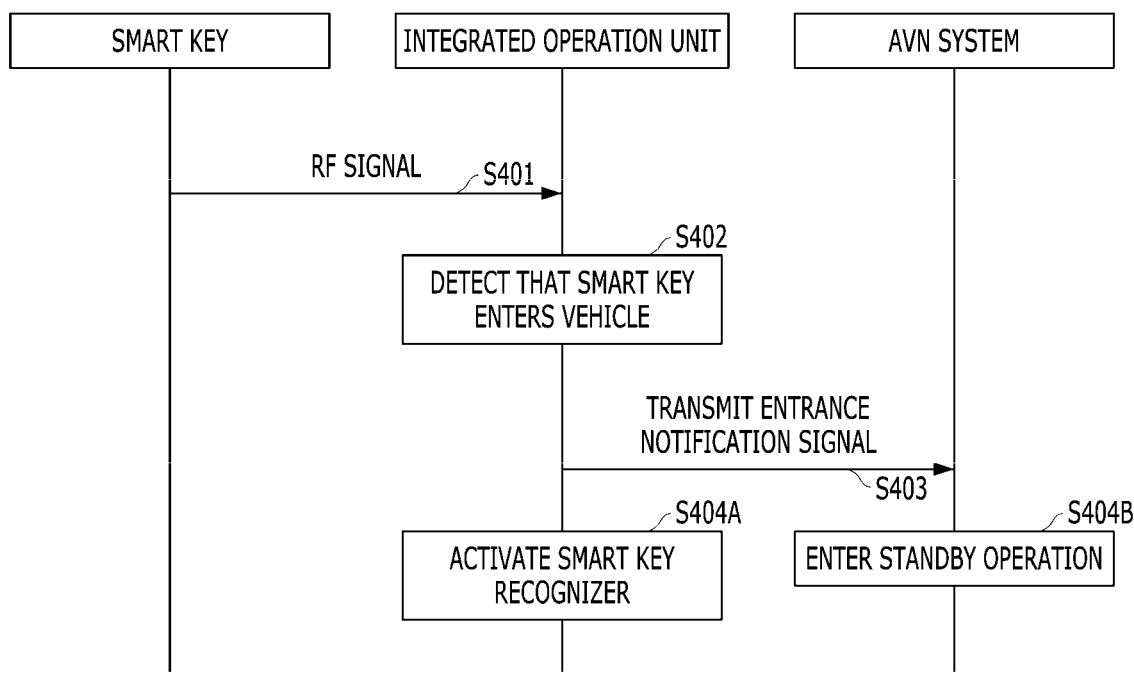
FIG. 4B is a flowchart illustrating an example of a process of performing a function when a smart key enters a vehicle according to an embodiment of the present disclosure.

The process shown in FIG. 4B may be performed before the process shown in FIG. 4A.

Referring to FIG. 4B, the smart key 200 may transmit a predetermined radio frequency (RF) signal at a predetermined period (S401). When such a signal is detected inside the vehicle by the integrated operation unit 100 (or the smart key controller) (S402), an entrance notification signal indicating that the smart key enters the vehicle may be transmitted to the AVN system (S403).

As entrance of the smart key 200 into the vehicle is detected, the integrated operation unit 100 may activate the smart key recognizer 130 (S404A). For example, power may be applied to the wireless charging transmission coil 131 and the electromagnets 132 of the smart key recognizer 130.

In addition, when the entrance notification signal is received, the AVN system may enter standby operation (S404B). For example, the AVN system may perform pre-booting for rapid operation or output a predetermined welcome message when booting is completed.

Figure 5A:
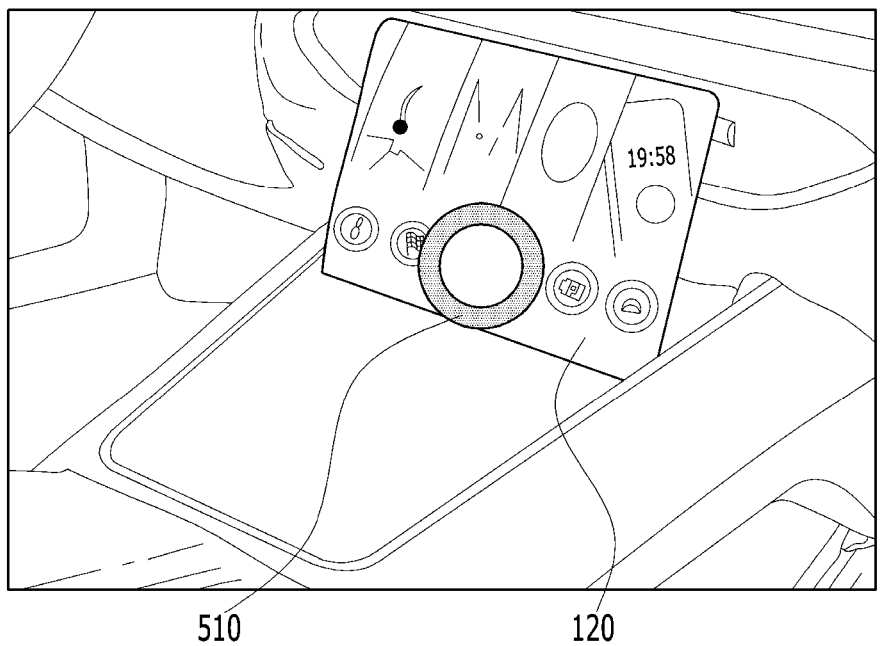
FIGS. 5A and 5B are views showing an example of attaching a smart key according to an embodiment of the present disclosure to a vehicle.
Figure 5B:
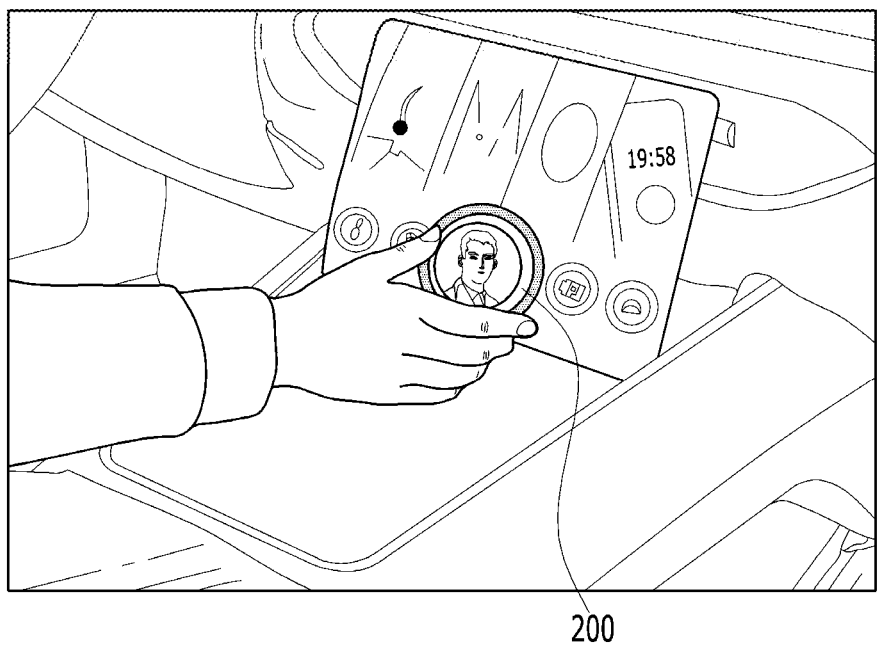
Figure 6A:
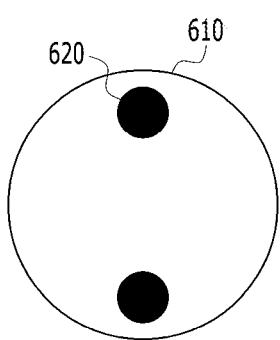
FIGS. 6A, 6B, 6C, 6D, 6E, and 6F are views showing an example of the arrangement of a fixing unit for fixing a smart key according to an embodiment of the present disclosure.
Figure 6B:
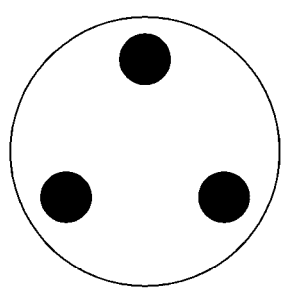
Figure 6C:
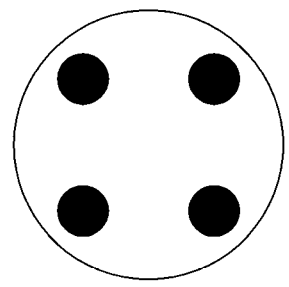
Figure 6D:
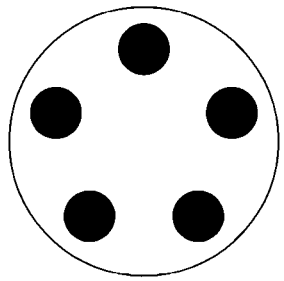
Figure 6E:
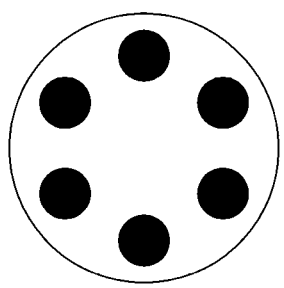
Figure 6F:
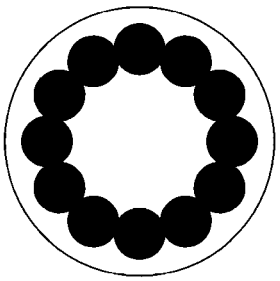

Next, a detailed example of attaching a smart key will be described with reference to FIGS. 5A and 5B. FIGS. 5A and 5B are views showing an example of attaching a smart key according to an embodiment of the present disclosure to a vehicle.

First, referring to FIG. 5A, the display 120 of the integrated operation unit 100 is provided at the lower end of a center fascia and the smart key is ready to be attached to the lower central area 510 of the display 120. At this time, a predetermined display object (e.g., a circular object corresponding to the actual size of the smart key displayed at the attachment position) may be displayed in the lower central area 510 to correspond to the attachment position, such that the user visually recognizes the attachment position.

In this state, when the smart key 200 is attached to the lower central area 510 of the display 120 as shown in FIG. 5B, the image of a driver corresponding to the welcome function may be displayed on the display of the smart key 200.

Of course, the area 510, to which the smart key 200 will be attached, needs to include a permanent magnet or an electromagnet as a portion for fixing the smart key by magnetic force, along with the smart key detector 130, as described above. The fixing unit will be described with reference to FIGS. 6A to 6F. FIGS. 6A to 6F are views showing an example of the arrangement of a fixing unit for fixing a smart key according to an embodiment of the present disclosure.

In FIGS. 6A to 6F, a large circle corresponds to the planar shape of the smart key 200 and indicates the attachment position 610 of the smart key 200, and small circles 620 indicate positions where permanent magnets or electromagnets are disposed. For example, all the small circles 620 may be permanent magnets or electromagnets or some of the small circles may be permanent magnets and the other small circles may be electromagnets.

Two or more electromagnets or permanent magnets may be provided such that the smart key 200 itself does not rotate by operation of the dial 210 after the smart key 200 is attached. In addition, the electromagnets or permanent magnets may be symmetrically disposed with respect to the center of the attachment position 610. Therefore, the smart key is easily attached at an accurate position, only by disposing the smart key 200 to be close to the attachment position. Of course, the position and number of electromagnets or permanent magnets within the attachment position 610 may be equally applied to the attachment portion 230 of the smart key 200.

In addition, when the electromagnets are used, the electromagnets may be configured to generate magnetic force only when the smart key 200 is detected by the smart key detector 130, in order to reduce power consumption.

Next, the welcome and start functions using the smart key will be described with reference to FIGS. 7A to 7D. FIGS. 7A to 7D are views showing an example of performing welcome and start functions using a smart key according to an embodiment of the present disclosure.

Figure 7A:
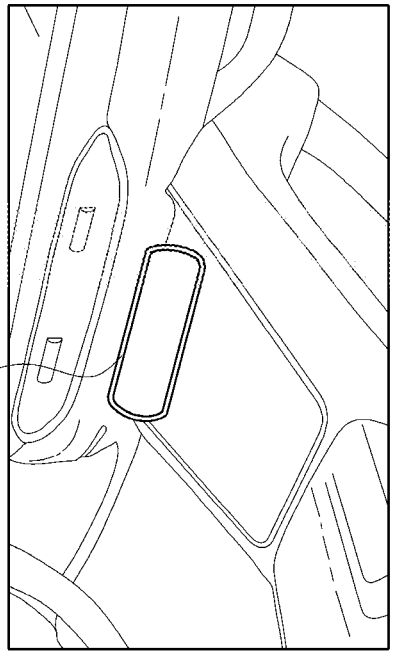
FIGS. 7A, 7B, 7C, and 7D are views showing an example of performing welcome and start functions using a smart key according to an embodiment of the present disclosure.

Referring to FIG. 7A, the display 120 of the integrated operation unit 100 is disposed at the lower end of the center fascia and the attachment area may be disposed at the center of the display 120. Until the vehicle starts, the display 120 is turned off and only the smart detector 130 is in an on state. At this time, the smart key detector 130 may be activated when the smart key controller SMK detects the smart key 200 inside the vehicle.

Figure 7B:
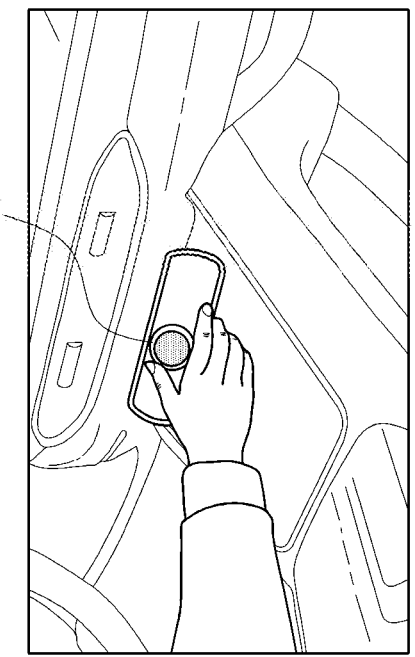

In this state, when the driver rides in the vehicle and the smart key 200 is attached to the center of the display 120 as shown in FIG. 7B, start text may be displayed on the display of the smart key 200. At this time, when the driver pushes the smart key 200, the vehicle may start.

Figure 7C:
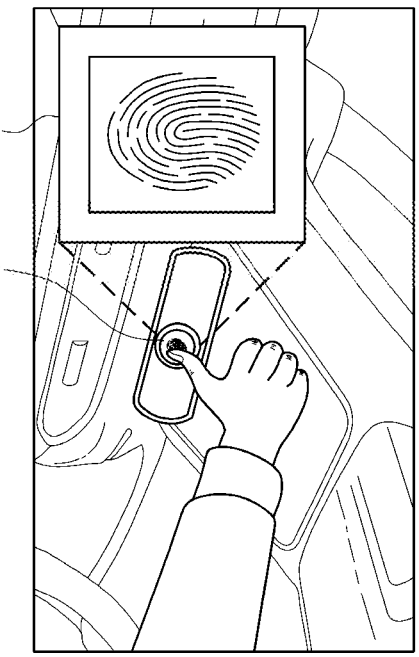

At this time, when the display of the smart key 200 is provided with a fingerprint recognition sensor, as shown in FIG. 7C, the vehicle may start through fingerprint recognition. In addition, the recognized fingerprint shape may be displayed on the display 220 of the smart key 200. Of course, the displayed fingerprint shape may be different from an actually recognized fingerprint shape.

Figure 7D:
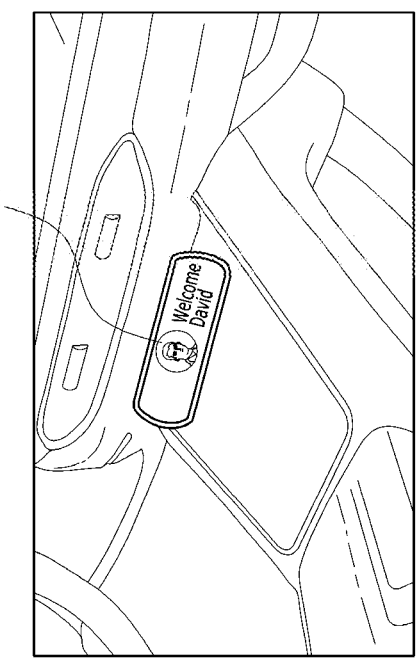

Meanwhile, unlike FIG. 7B, when the driver rides in the vehicle and then the smart key 200 is attached to the attachment area, as shown in FIG. 7D, the image of the driver may be output on the display of the smart key 200 and a welcome message may be output on the display 120 of the integrated operation unit 100. After the welcome message is output, the state may transition to the state shown in FIG. 7B again.

Figure 8A:
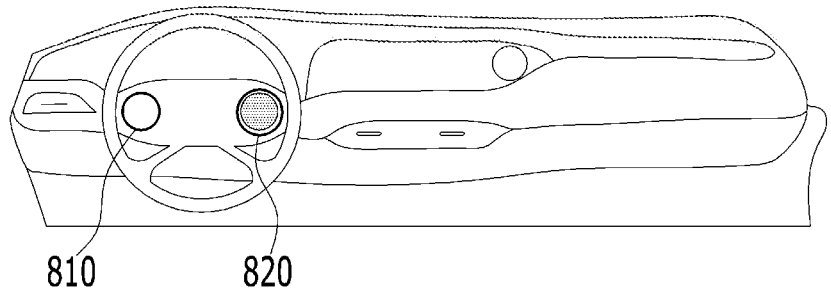
FIGS. 8A, 8B, and 8C are views showing attachment areas according to an embodiment of the present disclosure.
Figure 8B:
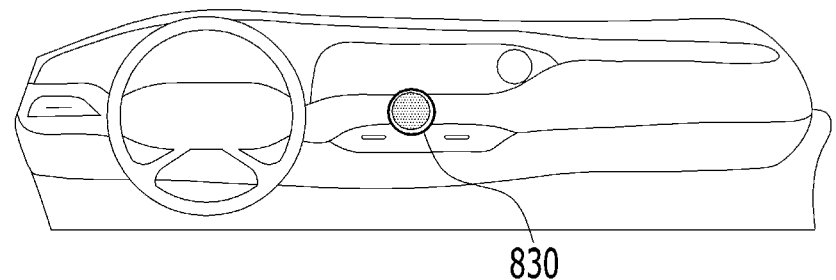
Figure 8C:
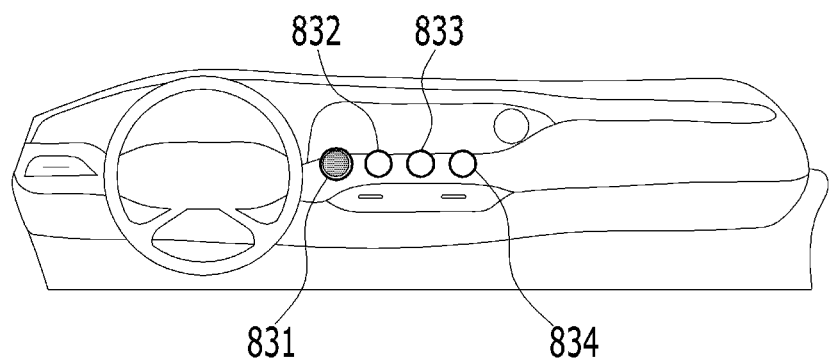

In the above-described embodiments, the attachment area is disposed on or near the display 120 of the integrated operation unit 100 located at the lower end of the center fascia. However, this is an example and the attachment area may be variously changed. This will be described with reference to FIGS. 8A to 8C. FIGS. 8A to 8C are views showing attachment areas according to an embodiment of the present disclosure.

Referring to FIG. 8S, the attachment area may be a point 810 or 820 of a steering wheel. Alternatively, an attachment area may be disposed at the center of the center fascia 830 as shown in FIG. 8B.

Of course, in some embodiments, as shown in FIG. 8C, a plurality of attachment areas 831, 832, 833 and 834 may be provided at the center of the center fascia. In this case, a plurality of smart keys 200 may be simultaneously attached to configure portions of the operation system and different controlled functions may be applied to the attachment positions. For example, when the smart key 200 is attached to a leftmost attachment area 821, air conditioning control may be immediately performed through the dial 210 and, when the smart key 200 is attached to a rightmost attachment area 834, multimedia output volume control may be immediately performed through the dial 210. Of course, such functions are merely examples, the present disclosure is not limited thereto, and various changes may be made.

Figure 9A:
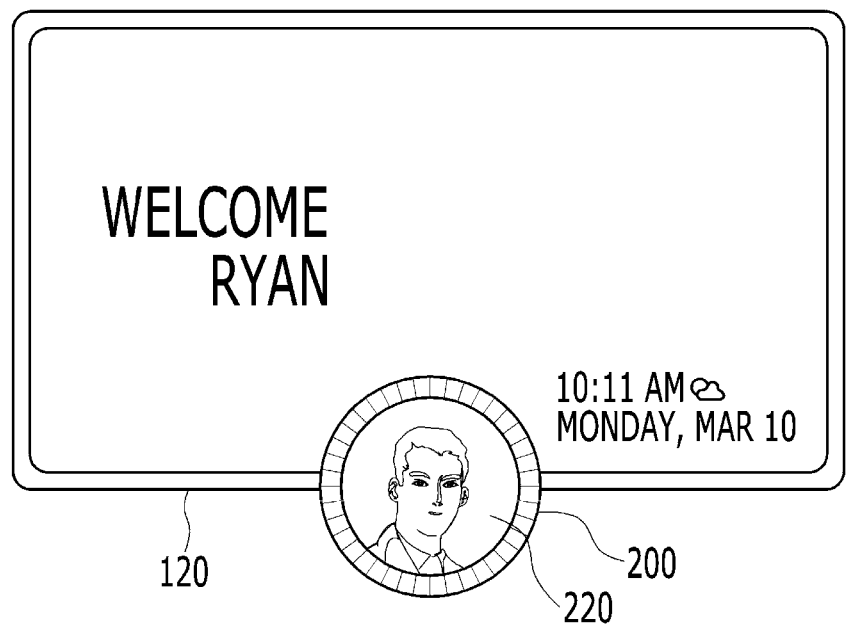
FIGS. 9A and 9B are views showing the form of a user interface configured along with a display of an integrated controller when a smart key according to an embodiment of the present disclosure is attached to an attachment area of a vehicle.
Figure 9B:
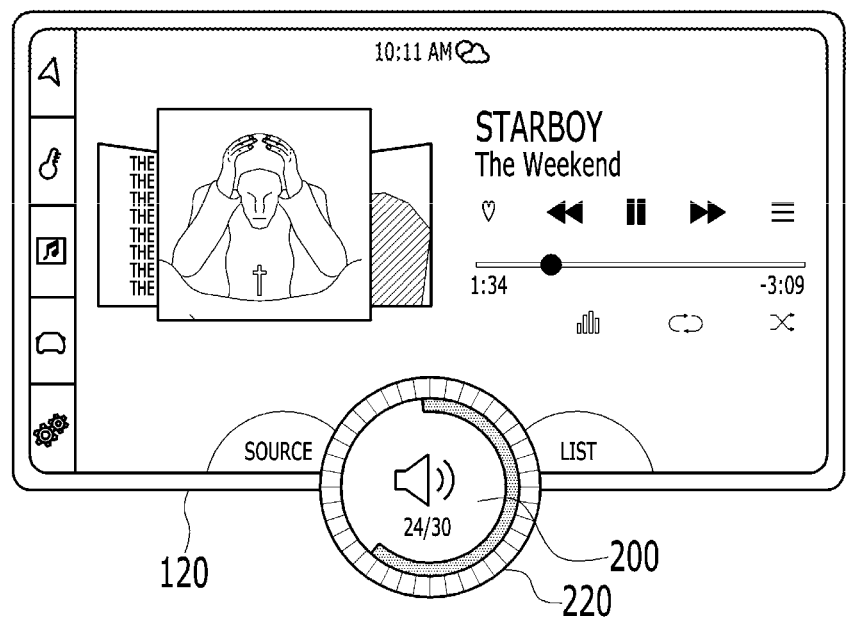

Next, a user interface provided when a smart key is attached will be described with reference to FIGS. 9A and 9B. FIG. 9A and FIG. 9B are views showing the form of a user interface configured along with a display of an integrated controller when a smart key according to an embodiment of the present disclosure is attached to an attachment area of a vehicle. In FIG. 9A and FIG. 9B, assume that the attachment area is disposed in the lower central portion of the display 120 of the integrated operation unit 100.

First, referring to FIG. 9A, when the smart key 200 is attached for the first time after the driver rides in the vehicle, the image of the driver may be output on the display 220 of the smart key 200 and additional information such as time and date may be displayed on the display 120 of the integrated operation unit 100 along with the welcome message.

In addition, referring to FIG. 9B, when a multimedia playback function is selected and a media player is output on the display 120 of the integrated operation unit 100, current volume information may be displayed on the display 220 of the smart key 200. In this state, when the dial 210 is operated, the volume value may be changed according to a degree and direction of rotation.

Hereinafter, alignment of the user interface in the forward direction will be described in greater detail with reference to FIGS. 10 and 11.

Figure 11:
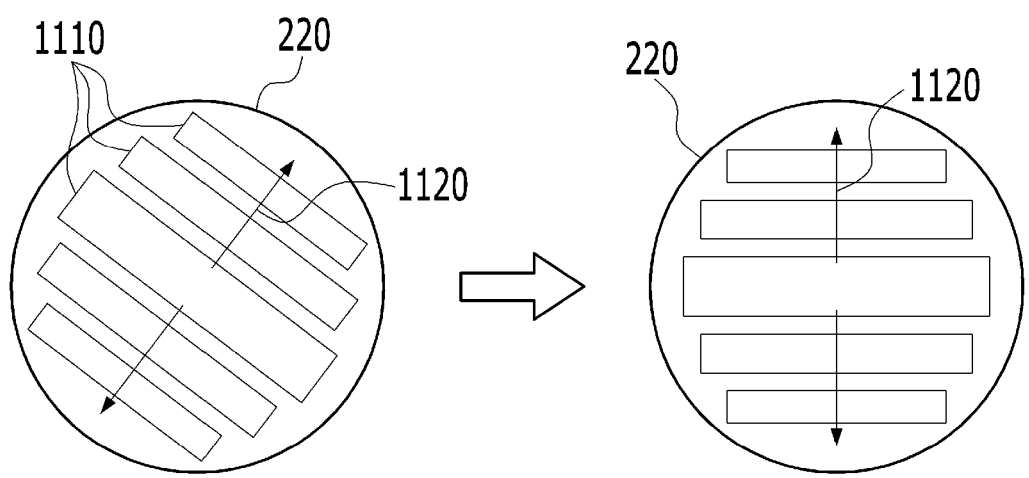
FIG. 11 is a view showing an example of a form in which a user interface according to an embodiment of the present disclosure rotates.

FIG. 10 is a view showing an example of a user interface alignment process according to an embodiment of the present disclosure, and FIG. 11 is a view showing an example of a form in which a user interface according to an embodiment of the present disclosure rotates.

The process of FIG. 10 may be performed after step S410 of recognizing attachment described with reference to FIG. 4A and, more preferably, after step S430.

Referring to FIG. 10, after the smart key 200 is attached, the sensor unit 270 may determine the slope of the smart key 200 (S1010). Here, the slope may mean a difference between a predetermined direction value and a gravity (or vertical) direction value.

As the slope is determined, the controller 260 may rotate the user interface displayed on the display 220 according to the determined slope (S1020).

This process will be described with reference to FIG. 11. In FIG. 11, assume that the user interface displayed on the display 220 has a configuration in which a plurality of display objects 1110 is vertically arranged and is regarded as being oriented in a forward direction when an arrow 1120 is parallel to the direction of gravity.

After the smart key 200 is attached, in a state in which the user interface aligned according to a predetermined direction value is displayed on the display as shown in the left side of FIG. 11, the user interface may be rotated and aligned in the forward direction as shown in the right side of FIG. 11 based on the slope detected by the sensor unit 270.

Returning to FIG. 10 again, the controller 260 determines whether the slope is stabilized (S1030). Here, the stable slope may mean that the detected slope change in a predetermined range continues for a predetermined time or more.

Upon determining that the slope is stabilized, the controller 260 may stop rotation of the user interface and fix an angle (S1040). Otherwise, slope determination (S1010) and user interface rotation (S1020) may be repeated until the slope is stabilized.

In addition to the above-described functions, various controlled functions shown in Table 1 below may be performed when the smart key 200 according to the embodiment is attached to the vehicle.

TABLE 1

| Menu item | Controlled function |
| --- | --- |
| Profile loading | Loading of profile through user fingerprint recognition of display |
| Home | Menu movement/menu selection |
| Media | Volume/music change/source change |
| Navigation | Zoom in & out/go to preferred destination |
| Vehicle | Drive mode setting/ADAS integrated setting |
| Air conditioning | Air volume/temperature/mode setting |
| Settings | Menu selection/list movement/detailed increase/decrease setting |

Meanwhile, the smart key 200 according to the embodiments of the present disclosure may provide various functions using the display 220 even outside the vehicle. This will be described with reference to FIGS. 12A to 12D. FIGS. 12A to 12D are views showing an example of the function of a smart key according to an embodiment of the present disclosure.

Figure 12A:
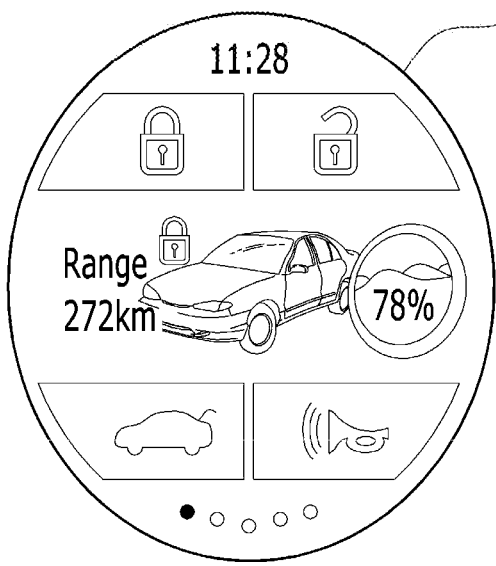
FIGS. 12A, 12B, 12C, and 12D are views showing an example of a smart key function according to an embodiment of the present disclosure.

Referring to FIG. 12A, a touch button corresponding to a vehicle door lock/unlock/trunk open/horn function may be displayed outside the vehicle similarly to a general smart key, and vehicle state information may also be displayed.

Figure 12B:
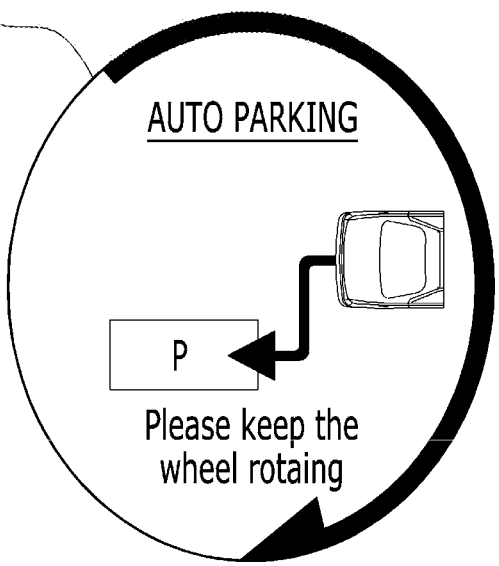

In addition, an automatic parking mode is activated through predetermined menu item operation, automatic parking may be performed through rotation of wheels as shown in FIG. 12B.

Figure 12C:
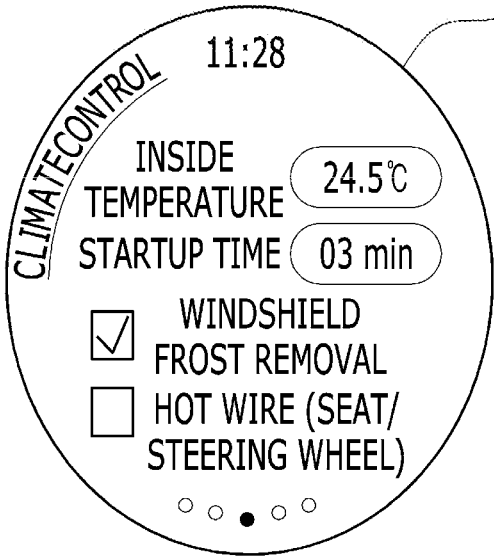

In addition, as shown in FIG. 12C, when a remote start function is performed, a user interface capable of selecting an air conditioning control value along with remote start may be output.

Figure 12D:
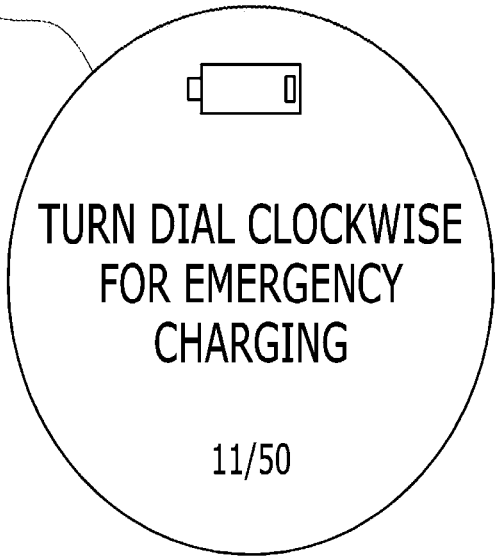

In addition, as shown in FIG. 12D, if the remaining battery level is equal to or less than a predetermined level, it is possible to indicate that emergency charging is possible through rotation of the dial 210. Such a function is performed using a charging function using an electromagnetic induction phenomenon between the coils 340 and the permanent magnets 320 described with reference to FIG. 2B. The number of rotations of the dial 210 necessary for charging up to a predetermined state may be displayed on the display 220.

In addition to the above-described functions, the smart key 200 according to the embodiment may perform various functions shown in Table 2 below outside the vehicle. In order to control such functions, the smart key 200 may communicate with the vehicle through the telematics center or cellular communication.

Figure 13A:
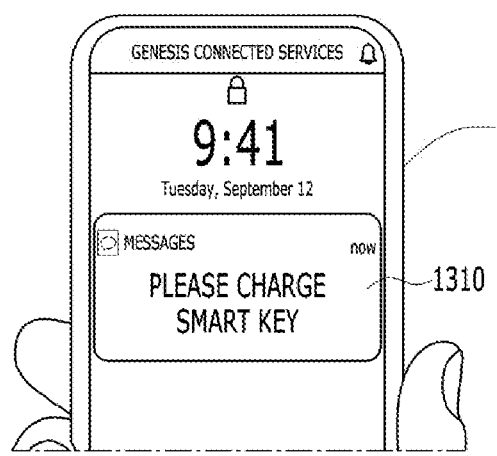
FIGS. 13A and 13B are views showing an example of an interworking function of a smart key according to an embodiment of the present disclosure and a smartphone.
Figure 13B:
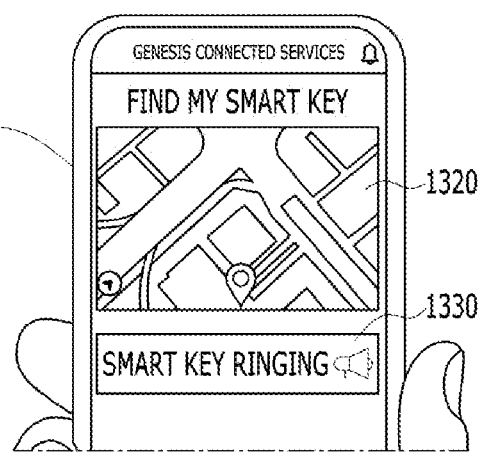

FIG. 13A and FIG. 13B are views showing an example of an interworking function of a smart key according to an embodiment of the present disclosure and a smartphone.

For example, while the smart key 200 is used as an operation system inside the vehicle, wireless charging is possible. However, when the vehicle is not used for a long time and the remaining battery level is at a predetermined level (e.g., less than 15%), information indicating that the smart key 200 needs to be charged may be transmitted to the smart device of the pre-registered driver through cellular communication. Therefore, as shown in FIG. 13A, a message 1310 indicating that the smart key needs to be charged may be displayed on the smartphone 1300 of the driver.

In another example, when the smart key 200 includes a GPS module and a speaker, as shown in FIG. 13B, when the driver executes a predetermined application through the smartphone, the position information of the smart key 200 may be received through cellular communication to display the position of the smart key on a map 1320. In addition, when the driver approaches the position displayed on the map 1320, a smart key ringing button 1330 may be selected to output sound through the speaker of the smart key 200, thereby conveniently finding the lost key.

Meanwhile, although the smart key 200 outputs a user interface through interworking with the display 120 of the integrated operation unit 100 in the above-described embodiment, the present disclosure is not limited thereto and the smart key may be attached to the periphery of a touch panel without a display function to configure the operation system of the vehicle along with the touch panel.

The vehicle control method using the smart key according to the above-described embodiments of the present disclosure may have the following effects.

First, the number of switches may be reduced, thereby increasing the degree of freedom in design of the smart key

TABLE 2

| Classification | Menu item | Main functions |
| --- | --- | --- |
| Smart key function | Door | Lock/unlock/trunk |
| | Automatic parking | Remote start, unparking/parking |
| Telematics | Vehicle state checking | Door open/air conditioning, etc. |
| | Vehicle remote control | Air conditioning/hot wire/window operation |
| Other content | Bio recognition | Checking of user through display fingerprint recognition |
| | Vehicle monitoring | Use of surround view monitor (SVM) Monitoring of situation around vehicle |
| | Interworking with smartphone | Sharing of Schedule/weather/destination/battery state |
| | Loss notification | Checking of position of key |

Some of the functions shown in Table 2 will be described in greater detail with reference to FIGS. 13A and 13B.

and the operation system of the vehicle and enhancing intuitive usability. For example, a smart key physical key button may be simplified. In another example, a center fascia and floor console switches may be integrated through function combination.

In addition, since the smart key is attached/detached using magnetic force, usability is enhanced. That is, since the magnetic force of the permanent magnet or electromagnet is used instead of a mechanical structure for fixing the smart key to the attachment area, it is possible to conveniently attach the smart key to the attachment area, only by disposing the smart key to be close to the attachment area.

In addition, when a wireless charging function is included in the smart key, since wireless charging is automatically performed by attaching the smart key, a separate charging slot need not be prepared or a battery need not be replaced.

In addition, it is not necessary for the driver to see a degree of operation without keeping eyes forward while driving the vehicle through a feeling of operation of a physical dial.

The in-vehicle control apparatus according to at least one embodiment of the present disclosure having the above-described configuration can provide a more convenient user interface in connection with the smart key provided with the display.

In addition, the present disclosure provides a function which varies according to the position of the smart key provided with the display inside the vehicle. In particular, the smart key configures a portion of the operation system inside the vehicle, thereby controlling various functions according to the state of the vehicle.

The effects of the present disclosure are not limited to the above-described effects and other effects which are not described herein may be derived by those skilled in the art from the above description of the embodiments of the present disclosure.

The disclosure can also be embodied as computer readable code on a computer readable recording medium. The computer readable recording medium is any data storage device that can store data which can thereafter be read by a computer system. Examples of the computer readable recording medium include read-only memory (ROM), random-access memory (RAM), CD-ROMs, magnetic tapes, floppy disks and optical data storage devices.

The above exemplary embodiments are therefore to be construed in all aspects as illustrative and not restrictive. The scope of the disclosure should be determined by the appended claims and their legal equivalents, not by the above description, and all changes coming within the meaning and equivalency range of the appended claims are intended to be embraced therein.

What is claimed is:

1. A vehicle control method using a smart key, the vehicle control method comprising:
   an integrated operation unit detecting attachment of the smart key through a smart key detector disposed in a predetermined attachment area inside a vehicle;
   the integrated operation unit transmitting information on a controlled function corresponding to a vehicle state to the smart key;
   outputting a first user interface corresponding to the information on the controlled function on a first display of the smart key;
   transmitting information on a result of operation from the smart key to the integrated operation unit when an operation unit provided in the smart key is operated; and
   the integrated operation unit controlling the controlled function based on the information on the result,
   wherein the smart key is fixed in the attachment area using magnetic force.

2. The vehicle control method according to claim 1, wherein the smart key has a cylindrical appearance, and wherein the first display is disposed at a center of the smart key in a circular shape.

3. The vehicle control method according to claim 2, wherein the operation unit includes a ring-shaped dial surrounding the first display.

4. The vehicle control method according to claim 3, wherein the dial includes one or more coils at the inside or the back surface thereof, and
   wherein the smart key further includes:
   one or more permanent magnets disposed in a predetermined shape; and
   a battery charged with power generated by an electromagnetic induction phenomenon by the permanent magnets in the one or more coils when the dial rotates.

5. The vehicle control method according to claim 1, further comprising:
   determining a slope through a detector for detecting a direction in which the smart key is disposed; and
   aligning a first user interface to correspond to the determined slope in the smart key.

6. The vehicle control method according to claim 5, wherein the aligning includes:
   rotating the first user interface based on the determined slope until the detected slope satisfies a predetermined stabilization condition; and
   fixing the slope of the first user interface when the stabilization condition is satisfied.

7. The vehicle control method according to claim 1, wherein the smart key recognizer includes an electromagnet,
   wherein the method further includes:
   an integrated controller detecting whether the smart key has entered the vehicle; and
   the integrated controller activating the electromagnet as the smart key has entered the vehicle.

8. The vehicle control method according to claim 1, wherein the integrated operation unit further includes a second display disposed around the smart key detector, and
   wherein the method further includes outputting a second user interface corresponding to the information on the controlled function through the second display.

9. The vehicle control method according to claim 8, wherein the first user interface and the second user interface integrally configure a user interface corresponding to the controlled function.

10. A non-transitory computer-readable recording medium having recorded thereon a program for executing the vehicle control method using the smart key according to claim 1.

11. An in-vehicle operation system comprising:
    an integrated operation unit including a smart key detector disposed in a predetermined attachment area in a vehicle, a first display disposed around the smart key detector to display a first user interface for a controlled function corresponding to a vehicle state and a controller configured to perform control to transmit information on the controlled function to the smart key when attachment of the smart key in the attachment area is detected through the smart key detector,
    wherein the integrated operation unit receives information on a result of operation through an operation unit provided in the smart key from the smart key and controls the controlled function based on the information on the result, and wherein the smart key detector includes an electromagnet for fixing the smart key in the attachment area at the rear surface of the first display.

12. The in-vehicle operation system according to claim 11, further comprising a smart key including a second display for displaying a second user interface corresponding to the information on the controlled function and the operation unit, wherein the smart key has a cylindrical appearance, and wherein the second display is disposed at a center of the smart key in a circular shape.

13. The in-vehicle operation system according to claim 12, wherein the operation unit includes a ring-shaped dial surrounding the second display.

14. The in-vehicle operation system according to claim 13, wherein the dial includes one or more coils at the inside or the back surface thereof, and wherein the smart key further includes:

one or more permanent magnets disposed in a predetermined shape; and a battery charged with power generated by an electromagnetic induction phenomenon by the permanent magnets in the one or more coils when the dial rotates.

15. The in-vehicle operation system according to claim 11, wherein the smart key:

determines a slope through a detector for detecting a direction in which the smart key is disposed; and aligns a second user interface to correspond to the determined slope.

16. The in-vehicle operation system according to claim 15, wherein the smart key rotates the second user interface based on the determined slope until the detected slope satisfies a predetermined stabilization condition and fixes the slope of the second user interface when the stabilization condition is satisfied.

17. The in-vehicle operation system according to claim 11, wherein an integrated controller activates the electromagnet as the smart key has entered the vehicle.

18. The in-vehicle operation system according to claim 11, wherein the integrated operation unit outputs a first user interface corresponding to the information on the controlled function through the first display.

19. The in-vehicle operation system according to claim 18, wherein the first user interface and a second user interface integrally configure a user interface corresponding to the controlled function.

20. The in-vehicle operation system according to claim 11, wherein the integrated operation unit gradually increases magnetic force of the electromagnet when the smart key approaches within a predetermined distance.

* * * * *